United States Patent
Xu et al.

(10) Patent No.: US 10,802,363 B2
(45) Date of Patent: Oct. 13, 2020

(54) ARRAY SUBSTRATE AND MANUFACTURING METHOD THEREFOR, DISPLAY DEVICE AND DRIVING METHOD THEREFOR

(71) Applicants: Hefei BOE Optoelectronics Technology Co., Ltd., Hefei (CN); BOE Technology Group Co., Ltd., Beijing (CN)

(72) Inventors: Haoshu Xu, Beijing (CN); Kui Gong, Beijing (CN); Xianxi Cui, Beijing (CN)

(73) Assignees: Hefei BOE Optoelectronics Technology Co., Ltd., Hefei, Anhui (CN); BOE Technology Group Co, Ltd., Beijing (CN)

( * ) Notice: Subject to any disclaimer, the term of this patent is extended or adjusted under 35 U.S.C. 154(b) by 0 days.

(21) Appl. No.: 16/322,718

(22) PCT Filed: Apr. 24, 2018

(86) PCT No.: PCT/CN2018/084243
§ 371 (c)(1),
(2) Date: Feb. 1, 2019

(87) PCT Pub. No.: WO2018/219067
PCT Pub. Date: Dec. 6, 2018

(65) Prior Publication Data
US 2019/0187504 A1   Jun. 20, 2019

(30) Foreign Application Priority Data
Jun. 2, 2017 (CN) .......................... 2017 1 0407555

(51) Int. Cl.
G02F 1/136 (2006.01)
G02F 1/1362 (2006.01)
(Continued)

(52) U.S. Cl.
CPC ........ *G02F 1/13624* (2013.01); *G02F 1/1333* (2013.01); *G02F 1/13306* (2013.01);
(Continued)

(58) Field of Classification Search
None
See application file for complete search history.

(56) References Cited

U.S. PATENT DOCUMENTS 5,333,004 A   7/1994 Mourey et al.
5,517,150 A   5/1996 Okumura
(Continued)

FOREIGN PATENT DOCUMENTS

CN   1287387 A   3/2001
CN   1437061 A   8/2003
(Continued)

OTHER PUBLICATIONS

Jul. 30, 2018—(WO) International Search Report and Written Opinion Appn PCT/CN2018/084243 with English Translation.
(Continued)

*Primary Examiner* — James A Dudek
(74) *Attorney, Agent, or Firm* — Banner & Witcoff, Ltd.

(57) ABSTRACT

An array substrate and a manufacturing method thereof, a display device and a driving method thereof. The array substrate includes: a first thin film transistor, a second thin film transistor and a pixel electrode, the pixel electrode being electrically connected to the first thin film transistor and the second thin film transistor, one of the first thin film transistor and the second thin film transistor being an n-type thin film transistor, and another one being a p-type thin film transistor.

12 Claims, 6 Drawing Sheets

(51) Int. Cl.
    *H01L 27/12*     (2006.01)
    *G02F 1/133*     (2006.01)
    *H01L 27/092*     (2006.01)
    *H01L 51/05*     (2006.01)
    *G02F 1/1333*     (2006.01)

(52) U.S. Cl.
    CPC .......... *H01L 27/092* (2013.01); *H01L 27/124* (2013.01); *H01L 27/1251* (2013.01); *H01L 51/0512* (2013.01); *G02F 2001/136245* (2013.01)

(56) References Cited

U.S. PATENT DOCUMENTS

| | | | |
|---|---|---|---|
| 6,306,213 B1 | 10/2001 | Yamazaki | |
| 2003/0146890 A1 | 8/2003 | Sasaki | |
| 2006/0151792 A1* | 7/2006 | Yamazaki | G02F 1/13624 257/72 |
| 2011/0069048 A1 | 3/2011 | Cao et al. | |
| 2013/0082914 A1 | 4/2013 | Matsumura et al. | |
| 2014/0160102 A1 | 6/2014 | Wang | |
| 2014/0291686 A1 | 10/2014 | Wang | |
| 2015/0325602 A1 | 11/2015 | Im | |
| 2017/0301703 A1 | 10/2017 | Li et al. | |
| 2018/0211984 A1* | 7/2018 | Zeng | H01L 51/105 |
| 2019/0187504 A1 | 6/2019 | Xu et al. | |

FOREIGN PATENT DOCUMENTS

| | | |
|---|---|---|
| CN | 102033372 A | 4/2011 |
| CN | 102937766 A | 2/2013 |
| CN | 103018987 A | 4/2013 |
| CN | 103034000 A | 4/2013 |
| CN | 103186001 A | 7/2013 |
| CN | 103715196 A | 4/2014 |
| CN | 104635396 A | 5/2015 |
| CN | 105137685 A | 12/2015 |
| CN | 106990574 A | 7/2017 |
| EP | 0487389 A1 | 5/1992 |
| JP | 2833289 B2 | 12/1998 |

OTHER PUBLICATIONS

May 24, 2009—(CN) First Office Action Appn 201710407555.1 with English Translation.
May 29, 2020—(CN) Second Office Action Appn 201710407555.1 with English Translation.

* cited by examiner

ARRAY SUBSTRATE AND MANUFACTURING METHOD THEREFOR, DISPLAY DEVICE AND DRIVING METHOD THEREFOR

CROSS-REFERENCE TO RELATED APPLICATIONS

The application is a U.S. National Phase Entry of International Application No. PCT/CN2018/084243 filed on Apr. 24, 2018, designating the United States of America and claiming priority to Chinese Patent Application No. 201710407555.1, filed on Jun. 2, 2017. The present application claims priority to and the benefit of the above-identified applications and the above-identified applications are incorporated by reference herein in their entirety.

TECHNICAL FIELD

Embodiments of the present disclosure relate to an array substrate and a manufacturing method of an array substrate, a display device and a driving method of a display device.

BACKGROUND

Thin film transistor liquid crystal displays (TFT-LCDs) are the most popular displays in the market, and have been widely used and applied to various aspects of our lives.

SUMMARY

At least one embodiment of the present disclosure provides an array substrate, and the array substrate includes: a first thin film transistor, a second thin film transistor electrically connected to a reference voltage terminal; a pixel electrode electrically connected to both the first thin film transistor and the second thin film transistor, the second thin film transistor being configured to conduct away (discharge) a turn-off current of the first thin film transistor upon the first thin film transistor being turned off.

According to the array substrate provided by one or more embodiments of the present disclosure, the first thin film transistor is used as a switching element to control a pixel to which the first thin film transistor belongs to be turned on or turned off.

According to the array substrate provided by one or more embodiments of the present disclosure, one of the first thin film transistor and the second thin film transistor is an N-type thin film transistor, and the other of the first thin film transistor and the second thin film transistor is a P-type thin film transistor.

According to the array substrate provided by one or more embodiments of the present disclosure, the first thin film transistor includes a first electrode and a second electrode, the second thin film transistor includes a third electrode and a fourth electrode, and the second electrode is electrically connected with the third electrode.

According to the array substrate provided by one or more embodiments of the present disclosure, the first electrode is electrically connected to a data line, the data line is configured to provide a data voltage for the pixel electrode by the first thin film transistor, and the fourth electrode is connected to the reference voltage terminal.

According to the array substrate provided by one or more embodiments of the present disclosure, the reference voltage terminal is configured to output a common voltage.

According to the array substrate provided by one or more embodiments of the present disclosure, the first thin film transistor further includes a first gate electrode, the second thin film transistor further includes a second gate electrode, and the first gate electrode is electrically connected with the second gate electrode.

According to the array substrate provided by one or more embodiments of the present disclosure, both the first thin film transistor and the second thin film transistor are located on a base substrate, the first thin film transistor further includes a first active layer, the second thin film transistor further includes a second active layer, the first electrode and the second electrode are spaced apart from each other and are in contact with the first active layer respectively, the third electrode and the fourth electrode are spaced apart from each other and are in contact with the second active layer respectively, the first electrode and the second electrode are located at a side of the first active layer away from the first gate electrode, the second active layer is located at a side of the third electrode and the fourth electrode away from the second gate electrode, the first gate electrode is right opposite to the first active layer in a direction perpendicular to the base substrate, the second gate electrode is right opposite to the second active layer in a direction perpendicular to the base substrate, and a gate insulating layer is arranged between the first active layer and the first gate electrode and between the second active layer and the second gate electrode.

According to the array substrate provided by one or more embodiments of the present disclosure, a material of one of the first active layer and the second active layer includes a-Si, p-Si or metal oxide, and a material of the other of the first active layer and the second active layer includes triphenyl amine, pentacene, phthalocyanine or oligothiophene.

According to the array substrate provided by one or more embodiments of the present disclosure, the second thin film transistor is configured to be turned off at least at a time upon the first thin film transistor being turned on.

At least one embodiment of the present disclosure further provides a manufacturing method of the array substrate, including: forming a first thin film transistor, forming a second thin film transistor, the second thin film transistor being electrically connected to a reference voltage terminal; forming a pixel electrode, the pixel electrode being electrically connected to both the first thin film transistor and the second thin film transistor, the second thin film transistor being configured to conduct away a turn-off current of the first thin film transistor upon the first thin film transistor being turned off.

According to the manufacturing method of the array substrate provided by one or more embodiments of the present disclosure, the first thin film transistor is used as a switching element to control a pixel which it belongs to be turned on and turned off.

According to the manufacturing method of the array substrate provided by one or more embodiments of the present disclosure, one of the first thin film transistor and the second thin film transistor is an N-type thin film transistor, and the other of the first thin film transistor and the second thin film transistor is a P-type thin film transistor.

According to the manufacturing method of the array substrate provided by one or more embodiments of the present disclosure, the first thin film transistor includes a first electrode and a second electrode, the second thin film transistor includes a third electrode and a fourth electrode, the second electrode is electrically connected to the third electrode, the first electrode is electrically connected to a data line, the data line is configured to provide a data voltage for the pixel electrode by the first thin film transistor, and the fourth electrode is connected to the reference voltage terminal.

According to the manufacturing method of the array substrate provided by one or more embodiments of the present disclosure, the first thin film transistor further includes a first gate electrode, the second thin film transistor further includes a second gate electrode, and the first gate electrode is electrically connected to the second gate electrode.

At least one embodiment of the present disclosure further provides a display device, and the display device includes any one of the array substrates described above.

At least one embodiment of the present disclosure further provides a driving method applied to the display device described above, and the driving method includes: applying a gate turn-on signal to the second thin film transistor at least at a portion of a time upon a gate turn-off signal being applied to the first thin film transistor.

According to the driving method applied to the display device provided by one or more embodiments of the present disclosure, the method includes: applying a same gate signal to both the first thin film transistor and the second thin film transistor, and applying the gate turn-on signal to the second thin film transistor during a time upon the gate turn-off signal being applied to the first thin film transistor.

According to the driving method applied to the display device provided by one or more embodiments of the present disclosure, the method includes: applying different gate signals to the first thin film transistor and the second thin film transistor, and applying the gate turn-on signal to the second thin film transistor at least at a portion of the time upon the gate turn-off signal being applied to the first thin film transistor.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the protection scope of the present disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object which is described is changed, the relative position relationship may be changed accordingly.

Figure 1:
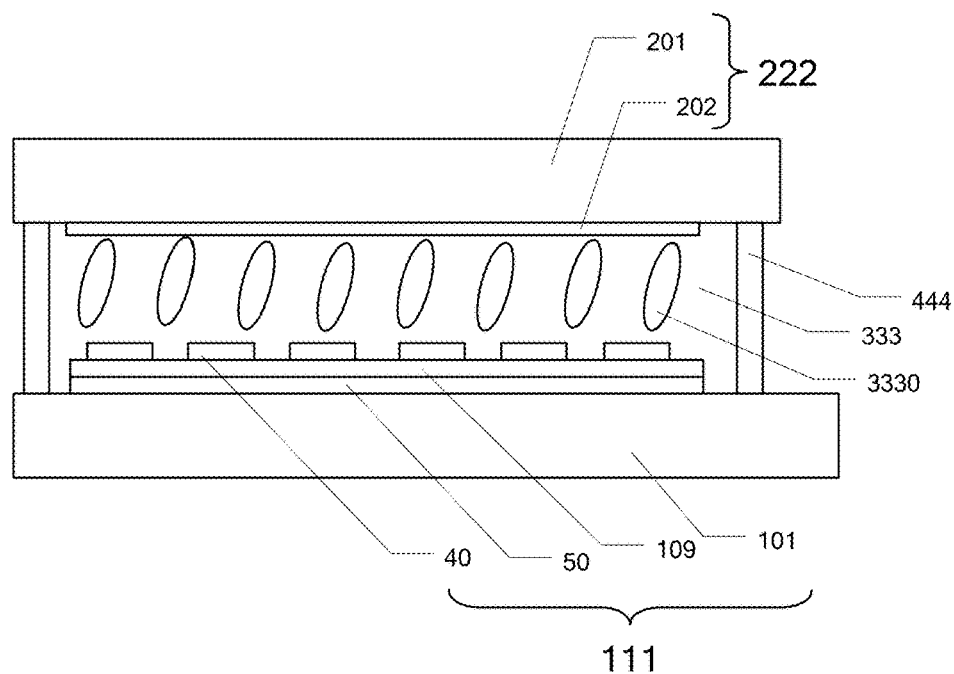
FIG. 1 is a schematic diagram of a liquid crystal display device.

As illustrated in FIG. 1, a TFT-LCD of an advanced super-dimension switching (ADS) mode is taken as an example for explanation. The TFT-LCD includes an array substrate 111, an opposing substrate 222, and a liquid crystal layer 333 arranged between the array substrate 111 and the opposing substrate 222. The array substrate 111 and the opposing substrate 222 may be bonded by adhesive 444 to form a cell to allow liquid crystal molecules 3330 to be sealed therein. For example, the array substrate 111 includes a first base substrate 101, a thin film transistor (TFT, not illustrated in FIG. 1) is disposed on the first base substrate 101; the opposing substrate 222 includes a second base substrate 201, a color filter layer 202 is disposed on the second base substrate 201. Rotation of liquid crystal molecules 3330 is controlled by changing electrical signals on the TFT, so as to determine whether polarized light of each of pixels is emitted or not, thereby achieving a purpose of displaying a color image. For example, at least one of the first base substrate 101 and the second base substrate 201 is a glass substrate.

As illustrated in FIG. 1, both a pixel electrode 40 and a common electrode 50 are arranged on the first base substrate 101, the pixel electrode 40 and common electrode 50 are insulated from each other (an insulating layer 109 may be disposed between the pixel electrode 40 and the common electrode 50), and are configured to form an electric field to drive the liquid crystal molecules 3330 to rotate to achieve a display. For example, the pixel electrode 40 in a slit shape is located above the common electrode 50 in a planar shape, and the pixel electrode 40 and the common electrode 50 form a multi-dimensional electric field. For example, the color filter layer 202 is disposed on the second base substrate 201 to achieve the color display, but a position of the color filter layer is not limited to this. Each of the pixels includes the pixel electrode 40, and the pixel electrode 40 is connected to the TFT acting as a switching element to control the pixel to be turned on or turned off. FIG. 1 does not illustrate the TFT which is electrically connected to the pixel electrode 40. The array substrate can be called as a TFT substrate.

Figure 2:
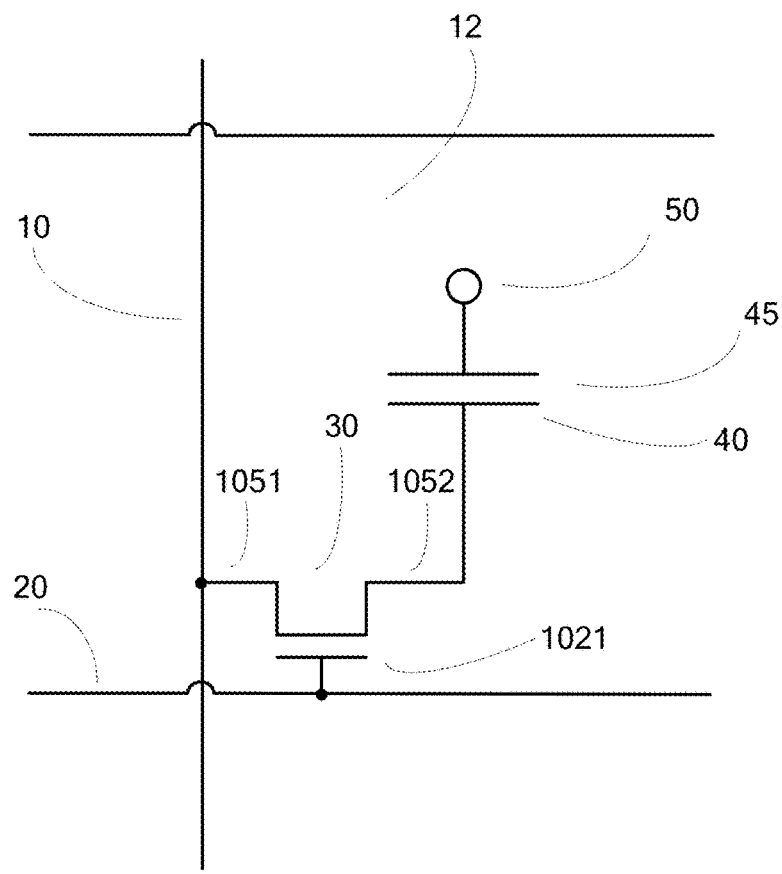
FIG. 2 is a schematic diagram of a liquid crystal display device or a driving method thereof.

FIG. 2 illustrates a driving structure of an array substrate. For example, a data line 10 is configured to provide a data voltage to a pixel 12 upon the first TFT 30 being turned on. On and off of the first TFT30 is controlled by voltage levels on a gate line 20 changing between a low voltage level and a high voltage level. The data line 10 and the gate line 20 are insulated from each other. The data line 10 is electrically connected to a first electrode 1051 (for example, a source electrode) of the first TFT 30, the gate line 20 is electrically connected to a first gate electrode 1021 of the first TFT 30, the pixel electrode 40 is electrically connected with a second electrode 1052 (for example, a drain electrode) of the first TFT 30. A pixel capacitor 45 is formed between the pixel electrode 40 and the common electrode 50, and upon the first TFT 30 being turned on, a pixel voltage can be input to the pixel electrode 40 by the data line 10 through the first TFT 30.

The turn-off current refers to a channel current of a TFT upon the TFT being turned off. Due to limitations of material and process level of a TFT device, a product has a problem of large turn-off current, which leads to common intractable defects of TFT-LCDs such as crosstalk and flicker.

For example, the TFT includes an N-type TFT (N-TFT) and a P-type TFT (P-TFT).

N-TFT is taken as an example. An active layer of the N-TFT is usually made of semiconductor materials such as a-Si, p-Si, metal oxide, or the like. The active layer is generally turned on upon the gate electrode being at a high voltage level and is turned off upon the gate electrode being at a low voltage level. The N-TFT is turned off upon the gate electrode being at the low voltage level, but there is still a small turn-off current (Ifr), and the turn-off current affects the pixel voltage which results in defects such as crosstalk and flicker, etc. For the N-TFT, the turn-off current refers to a channel current of the TFT upon the gate voltage being at a low level, which is limited by the material and the process level of the TFT device. Accordingly, the turn-off current of the P-TFT refers to a channel current of the TFT upon the gate voltage being at a high level, which is omitted herein.

Figure 3A:
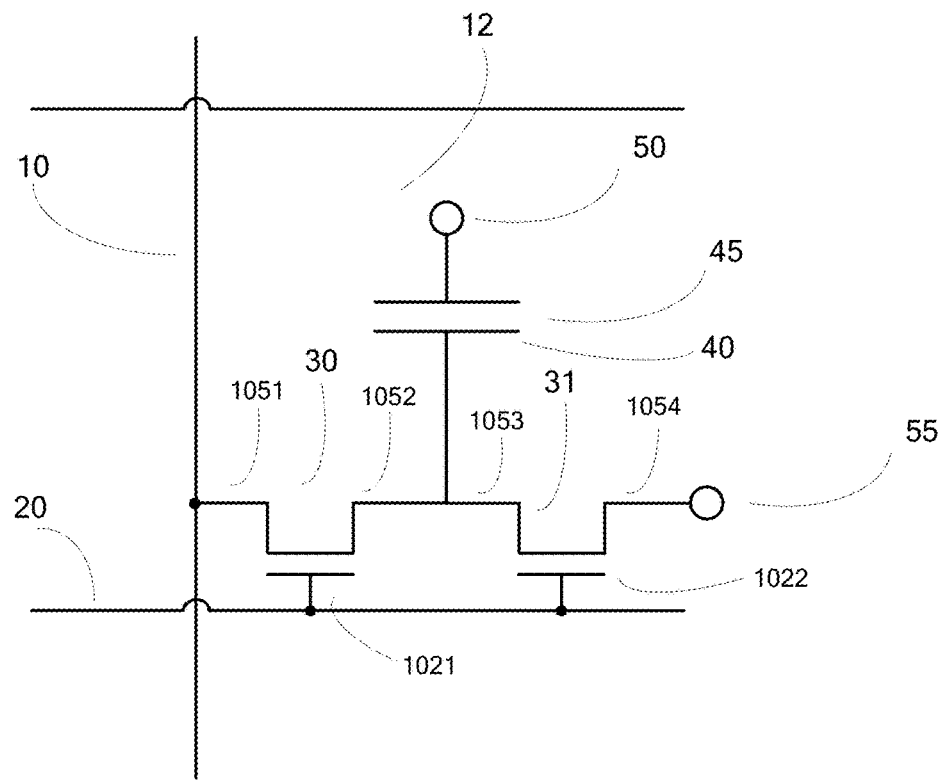
FIG. 3A is a schematic diagram of a liquid crystal display device or a driving method thereof provided by an embodiment of the present disclosure.

At least one embodiment of the present disclosure provides an array substrate, as illustrated in FIG. 3A, the array substrate includes: a first TFT 30; a second TFT 31 electrically connected to a reference voltage terminal 55; and a pixel electrode 40 electrically connected with both the first TFT 30 and the second TFT 31; the second TFT 31 is configured to conduct away a turn-off current of the first TFT 30 upon the first TFT 30 being turned off.

For example, one of the first TFT 30 and the second TFT 31 is an N-type TFT (N-TFT), and the other of the first TFT 30 and the second TFT 31 is a P-type TFT (P-TFT), embodiments of the present disclosure are illustrated by taking this case as an example, but not limited to this.

For example, the first TFT 30 is used as a switching element to control a pixel to which the first TFT 30 belongs to be turned on and turned off.

For example, the second TFT 31 is turned off at least at a time upon the first TFT 30 being turned on. For example, the second TFT 31 may also be turned off at least at a portion of the time upon the first TFT 30 being turned off.

In the array substrate provided by at least one embodiment of the present disclosure, one of the first TFT 30 and the second TFT 31 is configured to turn on a pixel, and the other of the first TFT 30 and the second TFT 31 is configured to conduct away a turn-off current and/or an induced current, in this way, an impact of the turn-off current and/or the induced current on the pixel is reduced, thereby avoiding the occurrence of related defects.

Figure 3B:
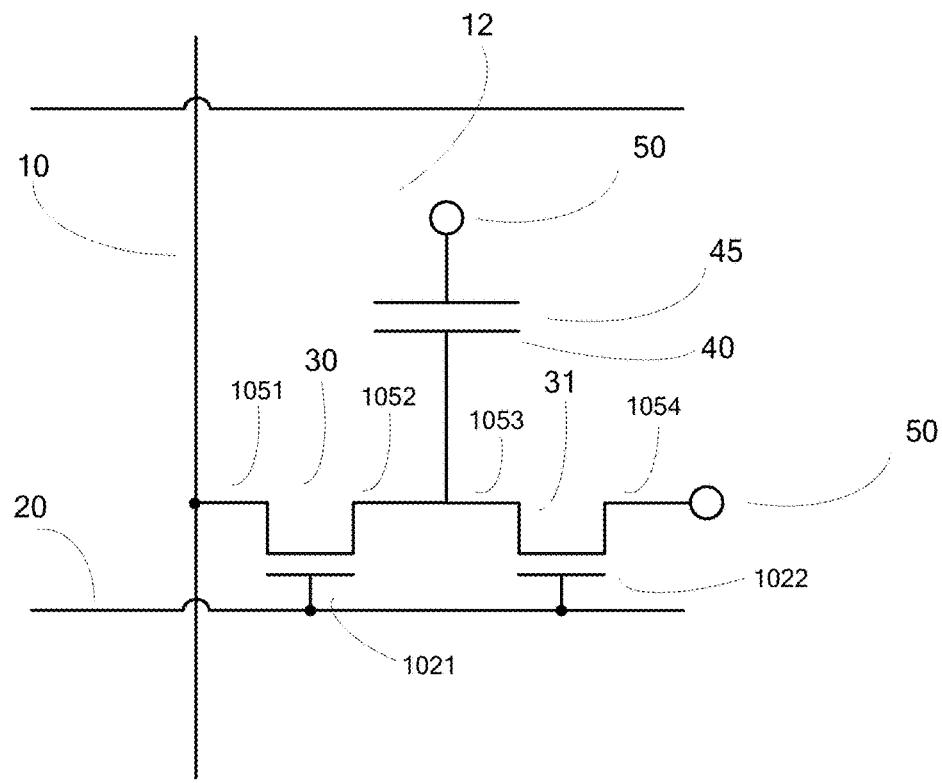
FIG. 3B is another schematic diagram of a liquid crystal display device or a driving method thereof provided by an embodiment of the present disclosure.

The array substrate provided by an embodiment of the present disclosure, still referring to FIG. 3A, the first electrode 1051 is electrically connected to the data line 10, the data line 10 is configured to provide a data voltage to the pixel electrode 40 through the first TFT 30, a fourth electrode 1054 is connected to the reference voltage terminal 55. The second TFT 31 may be connected to the pixel electrode 40 and the reference voltage terminal 55 respectively. For example, the reference voltage terminal can output a reset voltage. For example, the reset voltage is a common voltage. For example, as illustrated in FIG. 3B, the second TFT 31 is electrically connected to the common electrode 50 to realize that the fourth electrode 1054 is connected to the common voltage, which is not limited to this.

Descriptions are made with reference to the case where the first TFT 30 is an N-TFT, the second TFT 31 is a P-TFT, and the reference voltage terminal 55 outputs a common voltage, by way of example, and a driving principle of reducing turn-off current is emphasized.

Figure 4:
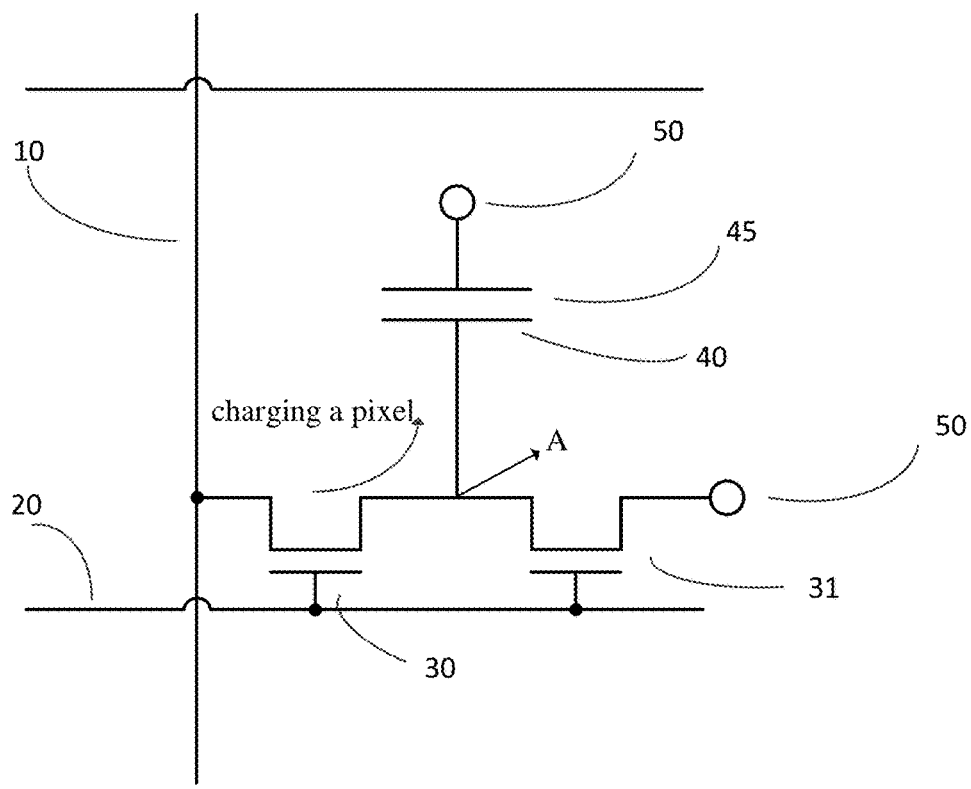
FIG. 4 is a schematic diagram of charging a pixel in a liquid crystal display device provided by an embodiment of the present disclosure.
Figure 5:
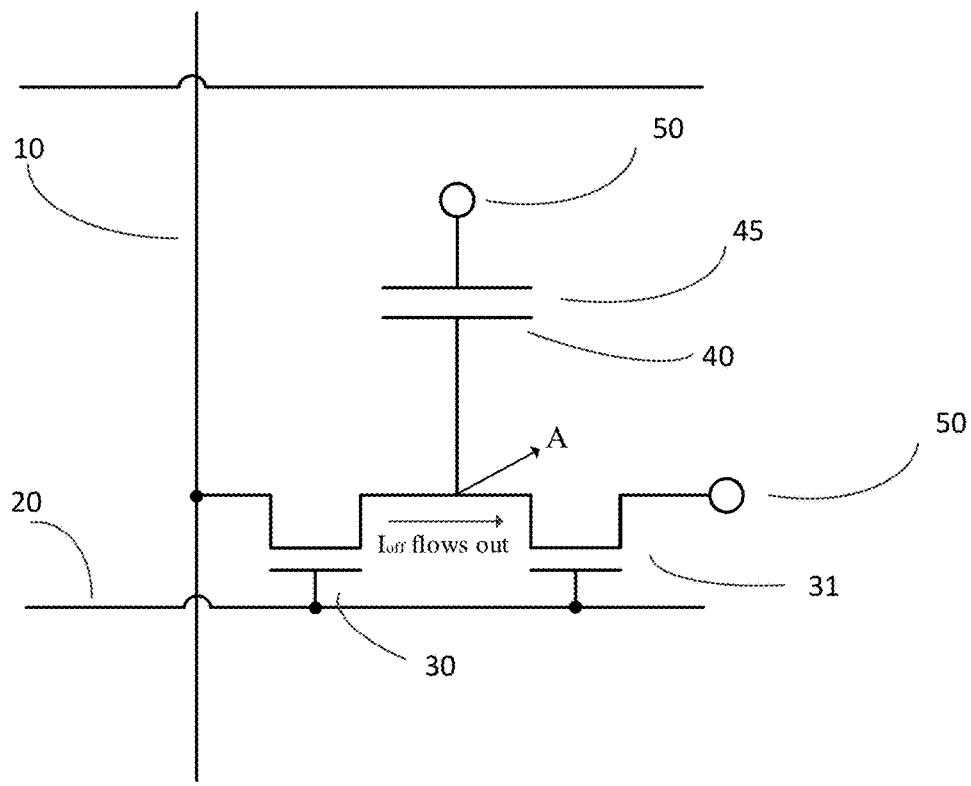
FIG. 5 is a schematic diagram of a turn-off current of a liquid crystal display device, provided by an embodiment of the present disclosure, flowing out.

As illustrated in FIG. 4, a case that a voltage threshold of the N-TFT is similar to a voltage threshold of the P-TFT is taken as an example, that is Vth≈NVth-P, upon a gate signal being at a high voltage level, that is VGS>Vth-N, the N-TFT is turned on, a data signal flows to the pixel capacitor through a source/drain electrode and the data line, and the pixel is lit, at this time, VGS>Vth-P, the P-TFT is turned off, and the turn-off current slightly reduces charging speed of the pixel, however, since the P-TFT has pulled the voltage level at a point A up to a common voltage (Vcom) before charging, the charging speed is improved to a certain extent. In the next frame, the gate signal is switched to a low voltage level, that is, VGS<Vth-N, the N-TFT is turned off, and the turn-off current of the N-TFT is conducted away by the turned on P-TFT (as illustrated in FIG. 5). Moreover, upon the pixel being turned off, the voltage level of the point A is pulled up to the common voltage so that a voltage difference between two ends of the pixel is zero, in this way, a brightness of L0 (zero gray level) is well reduced and a contrast ratio is increased.

The array substrate provided by an embodiment of the present disclosure, still referring to FIG. 3A, the first TFT 30 includes a first electrode 1051 and a second electrode 1052, the second TFT 31 includes a third electrode 1053 and a fourth electrode 1054, the second electrode 1052 and the third electrode 1053 are electrically connected with each other. One of the first electrode 1051 and the second electrode 1052 is a source electrode, the other of the first electrode 1051 and the second electrode 1052 is a drain electrode; one of the third electrode 1053 and the fourth electrode 1054 is a source electrode, the other of the third electrode 1053 and the fourth electrode 1054 is a drain electrode. The second electrode 1052 and the third electrode 1053 may be not directly electrically connected, but electrically connected by the pixel electrode 40. In a case that the second electrode 1052 and the third electrode 1053 are directly connected, a leakage current and/or the induced current can be conducted away quickly.

In embodiments of the present disclosure, in the N-TFT, the source electrode is at a low voltage level, the drain electrode is at a high voltage level, a positive gate voltage (a voltage difference between the gate voltage and a source voltage is greater than 0) can turn on the N-TFT. In the P-TFT, the source electrode is at a high voltage level, the drain electrode is at a low voltage level, and a negative gate voltage (a voltage difference between the gate voltage and a source voltage is less than 0) can turn on the P-TFT.

In a case that the first TFT 30 is the N-TFT and the second TFT 31 is the P-TFT, the first electrode 1051 is the source electrode, the second electrode 1052 is the drain electrode, the third electrode 1053 is the source electrode, and the fourth electrode 1054 is the drain electrode, and the drain electrode of the first TFT 30 is electrically connected to the source electrode of the second TFT 31. For example, in order to reduce the manufacture process, the first electrode 1051, the second electrode 1052, the third electrode 1053, and the fourth electrode 1054 are manufactured by a same patterning process.

According to the array substrate provided by an embodiment of the present disclosure, still referring to FIG. 3A, the first TFT 30 further includes a first gate electrode 1021, the second TFT 31 further includes a second gate electrode 1022, and the first gate electrode 1021 is connected to the second gate electrode 1022. For example, the first gate electrode 1021 and the second gate electrode 1022 are connected to the same gate line 20. Therefore, in a case that the first TFT 30 is turned on, the second TTF 31 is turned off, and in a case that the first TFT 30 is turned off, the second TTF 31 is turned on.

Figure 6:
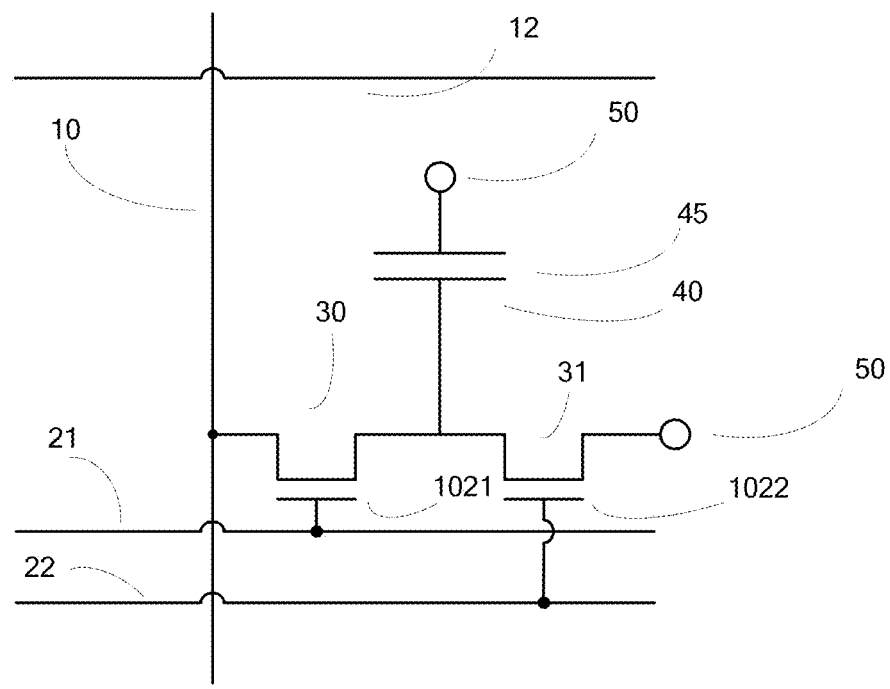
FIG. 6 is another schematic diagram of a liquid crystal display device or a driving method thereof provided by an embodiment of the present disclosure.

Of course, the first gate electrode 1021 and the second gate electrode 1022 may be not electrically connected. As illustrated in FIG. 6, the first gate electrode 1021 of the first TFT 30 is electrically connected to a first gate line 21, and the second gate electrode 1022 of the second TFT 31 is electrically connected to a second gate line 21, so that the first TFT 30 and the second TFT 31 can be applied with electrical signals independently.

Figure 7A:
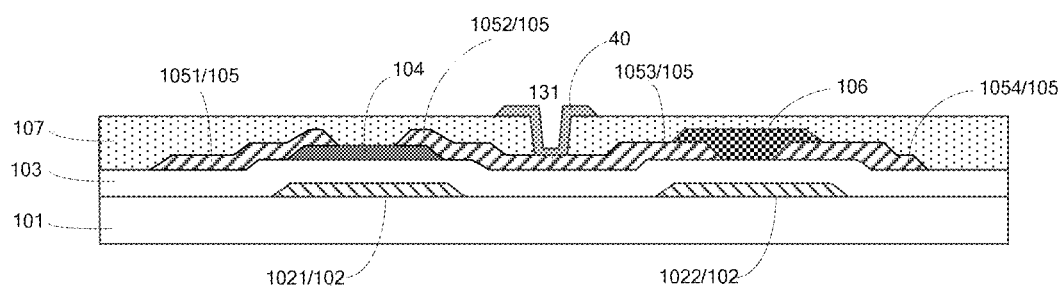
FIG. 7A is a sectional schematic view of an array substrate provided by an embodiment of the present disclosure.

According to the array substrate provided by an embodiment of the present disclosure, as illustrated in FIG. 7A, the first TFT 30 further includes a first active layer 104, and the second TFT 31 further includes a second active layer 106, the first gate electrode 1021 is opposite to the first active layer 104, and the second gate electrode 1022 is opposite to the second active layer 106. The first electrode 1051 and the second electrode 1052 are spaced apart from each other and are in contact with the first active layer 104 respectively, and the third electrode 1053 and the fourth electrode 1054 are spaced apart from each other and are in contact with the second active layer 106 respectively. The first electrode 1051 and the second electrode 1052 are disposed on the first active layer 104 (the first electrode 1051 and the second electrode 1052 are further away from the first base substrate 101 than the first active layer 104, and the first electrode 1051 and the second electrode 1052 are disposed on a side of the first active layer 104 away from the first gate electrode 1021). The second active layer 106 is disposed on the third electrode 1053 and the fourth electrode 1054 (the second active layer 106 is further away from the first base substrate 101 than the third electrode 1053 and the fourth electrode 1054, and the second active layer 106 is disposed on a side of the third electrode 1053 and the fourth electrode 1054 away from the second gate electrode 1022). In this way, the first TFT 30 forms a top contact type TFT, and the second TFT 31 forms a bottom contact type TFT. The active layer of the N-TFT is usually made of semiconductor materials such as a-Si, p-Si, metal oxide, or the like. The active layer of the P-TFT is made of organic materials such as triphenylamine, pentacene, phthalocyanine, oligothiophene, or the like.

As illustrated in FIG. 7A, the array substrate 111 further includes a gate insulating layer 103 and a passivation layer 107 which play the roles of insulating and protecting. The gate insulating layer 103 is disposed between the first active layer 104 and the first gate electrode 1021, and also between the second active layer 106 and the second gate electrode 1022. At least one of the gate insulating layer 103 and the passivation layer 107 is made of at least one selected from the group consisting of $SiO_x$, $SiN_y$, and $SiO_xN_y$. The passivation layer 107 may also be made of an organic material. The pixel electrode 40 is electrically connected to the second electrode 1052 and the third electrode 1053 by the first via hole 131 penetrating the passivation layer 107. FIG. 7A only illustrates a portion of the pixel electrode 40 electrically connected to the first TFT 30 and the second TFT 31, and the pixel electrode 40 can be formed into various shapes according to requirements. In a case that the second electrode 1052 and the third electrode 1053 are not in contact with each other, the pixel electrode 40 can be electrically connected to the second electrode 1052 and the third electrode 1053 through different via holes respectively.

Figure 7B:
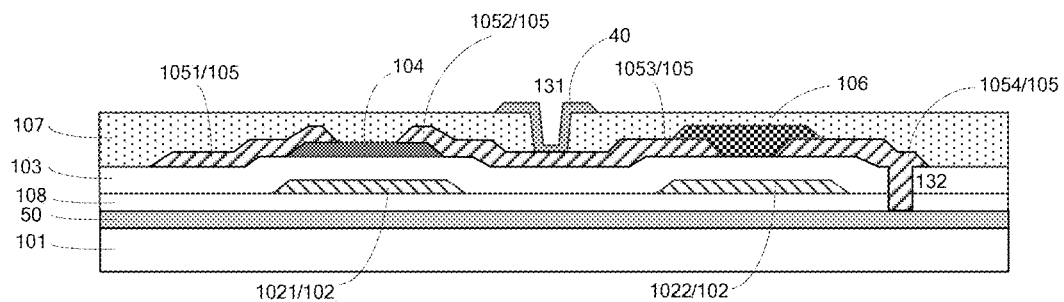
FIG. 7B is a sectional schematic view of an array substrate provided by another embodiment of the present disclosure.

As illustrated in FIG. 7B, the array substrate 111 further includes a common electrode 50, and the fourth electrode 1054 is electrically connected to the common electrode 50 through a second via hole 132 penetrating both the gate insulating layer 103 and a first insulating layer 108.

Figure 7C:
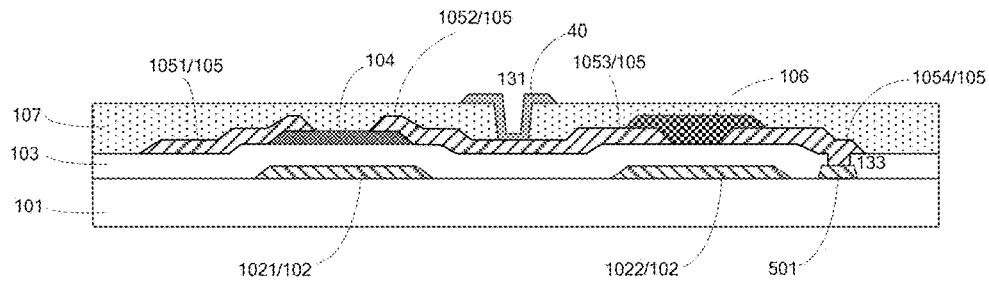
FIG. 7C is a sectional schematic view of an array substrate provided by still another embodiment of the present disclosure.
Figure 8:
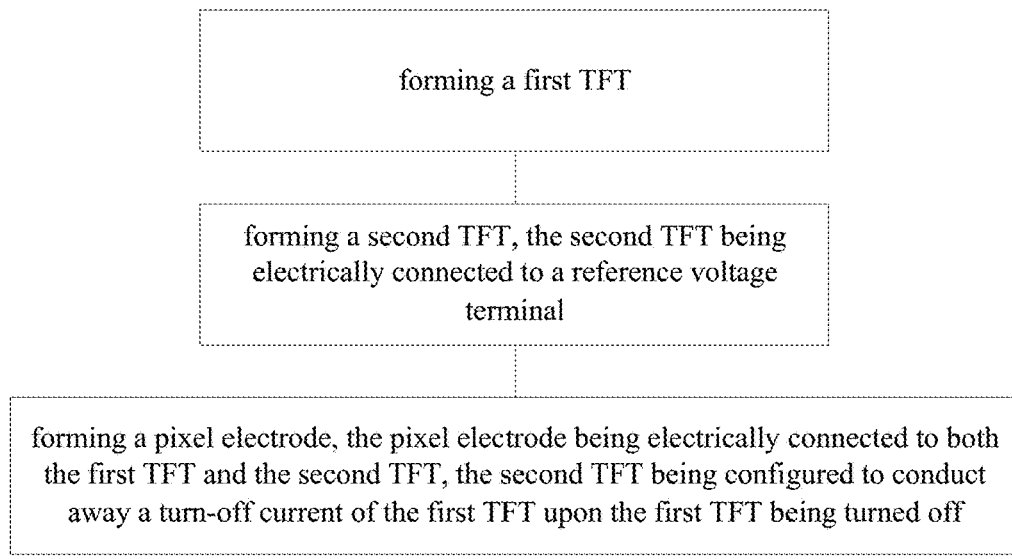
FIG. 8 is a schematic diagram of a manufacturing method of an array substrate provided by an embodiment of the present disclosure.

As illustrated in FIG. 7C, the array substrate 111 further includes a reference voltage line 501, and the fourth electrode 1054 is electrically connected to the reference voltage line 501 through a third via hole 133 penetrating the gate insulating layer 103. The reference voltage line 501 is formed at a same layer as the first gate electrode 1021 and the second gate electrode 1022 and is insulated from both the first gate electrode 1021 and the second gate electrode 1022.

The embodiments of the present disclosure are described with reference to the case where the first TFT 30 is a bottom-gate structure and the second TFT 31 is a bottom-gate structure, by way of example, but not limited thereto, and the TFT is arranged to be a top-gate structure or a bottom-gate structure as requirements. Furthermore, the first TFT 30 may also be designed to be of a bottom contact mode, and the second TFT 31 may also be designed to be of a top contact mode.

At least one embodiment of the present disclosure provides a manufacturing method of the array substrate, as illustrated in FIG. 3A, FIG. 6, FIG. 7A, FIG. 7B, FIG. 7C and FIG. 8, the manufacturing method includes: forming a first TFT 30; forming a second TFT 31, the second TFT 31 being electrically connected to a reference voltage terminal 55; forming a pixel electrode 40, the pixel electrode 40 being electrically connected with both the first TFT 30 and the second TFT 31, the second TFT 31 being configured to conduct away a turn-off current of the first TFT 30 upon the first TFT 30 being turned off.

For example, one of the first TFT 30 and the second TFT 31 is an N-TFT, and the other of the first TFT 30 and the second TFT 31 is a P-TFT.

According to the manufacturing method of the array substrate provided by an embodiment of the present disclosure, as illustrated in FIG. 7A, the first TFT 30 includes a first electrode 1051 and a second electrode 1052, the second TFT 31 includes a third electrode 1053 and a fourth electrode 1054, the second electrode 1052 and the third electrode 1053 are electrically connected.

According to the manufacturing method of the array substrate provided by an embodiment of the present disclosure, as illustrated in FIG. 3A, the first electrode 1051 is electrically connected to a data line 10, the data line 10 is configured to provide a data voltage to the pixel electrode 40 by the first TFT 30, the fourth electrode 1054 is connected to the reference voltage terminal 55. For example, as illustrated in FIG. 3B, the reference voltage terminal can output a common voltage.

According to the manufacturing method of the array substrate provided by an embodiment of the present disclosure, as illustrated in FIG. 3A and FIG. 7A, the first TFT 30 further includes a first gate electrode 1021, the second TFT 31 further includes a second gate electrode 1022, and the first gate electrode 1021 is connected to the second gate electrode 1022. Of course, the first gate electrode 1021 may be not electrically connected to the second gate electrode 1022.

According to the manufacturing method of the array substrate provided by an embodiment of the present disclosure, as illustrated in FIG. 7A to FIG. 7C, the first TFT 30 further includes a first active layer 104, and the second TFT 31 further includes a second active layer 106. The first electrode 1051 and the second electrode 1052 are spaced apart from each other and are respectively in contact with the first active layer 104, and the third electrode 1053 and the fourth electrode 1054 are spaced apart from each other and are in contact with the second active layer 106 respectively. The first electrode 1051 and the second electrode 1052 are disposed on the first active layer 104 (the first electrode 1051 and the second electrode 1052 are disposed on a side of the first active layer 104 away from the first gate electrode 1021). The second active layer 106 is disposed on the third electrode 1053 and the fourth electrode 1054 (the second active layer 106 is disposed on a side of the third electrode 1053 and the fourth electrode 1054 away from the second gate electrode 1022).

According to the manufacturing method of the array substrate provided by an embodiment of the present disclosure, as illustrated in FIG. 7A, the manufacturing method includes the following steps.

Step S1: forming a gate electrode layer 102 on the first base substrate 101. For example, the gate electrode layer 102 is made of a metal material. For example, the gate electrode layer 102 is made of at least one selected from the group consisting of aluminum metal, molybdenum, copper, etc., and the film forming method is generally a magnetron sputtering method, and the material and the film formation method of the gate electrode layer 102 is not limited in the embodiments of the present disclosure.

Step S2: forming a gate insulating layer 103 on the first base substrate 101 which is provided with the gate electrode layer 102. For example, the gate insulating layer 103 is formed by a chemical vapor deposition (such as plasma enhanced chemical vapor deposition, PECVD) method.

Step S3: forming a first active layer 104 of the first TFT 30 on the gate insulating layer 103.

Step S4: forming a source/drain electrode layer 105; the source/drain electrode layer 105 includes a first electrode 1051 and a second electrode 1052 of a first TFT 30, and a third electrode 1053 and a fourth electrode 1054 of a second TFT 31. For example, the source/drain electrode layer 105 is made of a metal material. The first electrode 1051, the second electrode 1052, the third electrode 1053, and the fourth electrode 1054 are formed by the same patterning process.

Step S5: forming a second active layer 106 of the second TFT 31 on the source/drain electrode layer 105.

Step S6: forming a passivation layer 107 on the second active layer 106.

Step S7: forming a first via hole 131 in the passivation layer 107.

Step S8: forming a pixel electrode 40 after forming the first via hole 131 in the passivation layer 107, the pixel electrode 40 being electrically connected to both the first TFT 30 and the second TFT 31 by the first via hole 131.

For example, as illustrated in FIG. 7B, before forming the gate electrode layer 102, the manufacturing method further includes forming a common electrode 50 and a first insulating layer 108, and the first insulating layer 108 is formed between the common electrode 50 and the gate electrode layer 102. Before forming the source/drain electrode layer 105, a second via hole 132 penetrating both the first insulating layer 108 and the gate insulating layer 103 is formed, so that the fourth electrode 1054 is electrically connect with the common electrode 50 by the second via hole 132.

The common electrode 50 in FIG. 7B may be a reference voltage line, so that the fourth electrode 1054 is connected to the reference voltage terminal. As illustrated in FIG. 7C, the reference voltage line 501 may be formed at a same layer as the first gate electrode 1021 and the second gate electrode 1022, the reference voltage line 501 is insulated from both the first gate electrode 1021 and the second gate electrode 1022, and the fourth electrode 1054 is electrically connected to the reference voltage line 501 by the third via hole 133 penetrating the gate insulating layer 103, which is not limited to this.

For example, the first TFT 30 is the N-TFT, and the first active layer 104 is an N-channel, a material of the N-channel is an inorganic material such as a-Si, p-Si, metal oxide, and the like. A device with N-TFT is turned on upon the gate electrode being at a high voltage level, and is turned off upon the gate electrode being at a low voltage level. The second TFT 31 is the P-TFT, and the second active layer 106 is a P-channel, a material of the P-channel is an organic material such as triphenylamine, pentacene, phthalocyanine, oligothiophene, and the like. The P-TFT is turned on upon the gate electrode being at a low voltage level, and is turned off upon the gate electrode being at a high voltage level.

Each of the film layers may be formed by a patterning process. The patterning or the patterning process may only include a photolithographic process, or may include a photolithographic process and an etching process, or may include other processes for forming a predetermined pattern, such as printing, inkjeting and other methods. The photolithographic process includes the processes of forming a film, exposing, developing, etc., and forming a pattern by using a photoresist, a mask, an exposure machine etc. A corresponding patterning process can be selected in accordance with the structure formed in the embodiments of the present disclosure.

In the embodiments of the present disclosure, "a same layer" refers to a layer structure formed by a film layer for forming a specific pattern by a same film forming process, and then formed by one patterning process by using a same mask plate. Depending on specific patterns, a patterning process may include multiple exposures, development or etching processes, and the specific pattern in the formed layer structure is continuous or discontinuous, and the specific pattern may be at different heights or have different thicknesses.

At least one embodiment of the present disclosure further provides a display device, and the display device includes any one of the array substrates provided by the embodiments of the present disclosure.

For example, the display device includes a liquid crystal display device, which is not limited to this.

At least one embodiment of the present disclosure further provides a driving method of the display device, and the driving method includes: applying a gate turn-on signal to the second TFT 31 at least at a portion of the time upon a gate turn-off signal being applied to the first TFT 30.

For example, the display device can be progressively scanned (scanning the gate lines progressively) to display a frame of an image. For example, upon a row of pixels being turned on, corresponding data signals (data voltages) is input to pixels in the row. For example, pixels in the (N+1)th row are turned on after the pixels in the Nth row are turned off, which is not limited to this. For example, the pixels in the (N+1)th row are turned on before the pixels in the Nth row are turned off.

Figure 9:
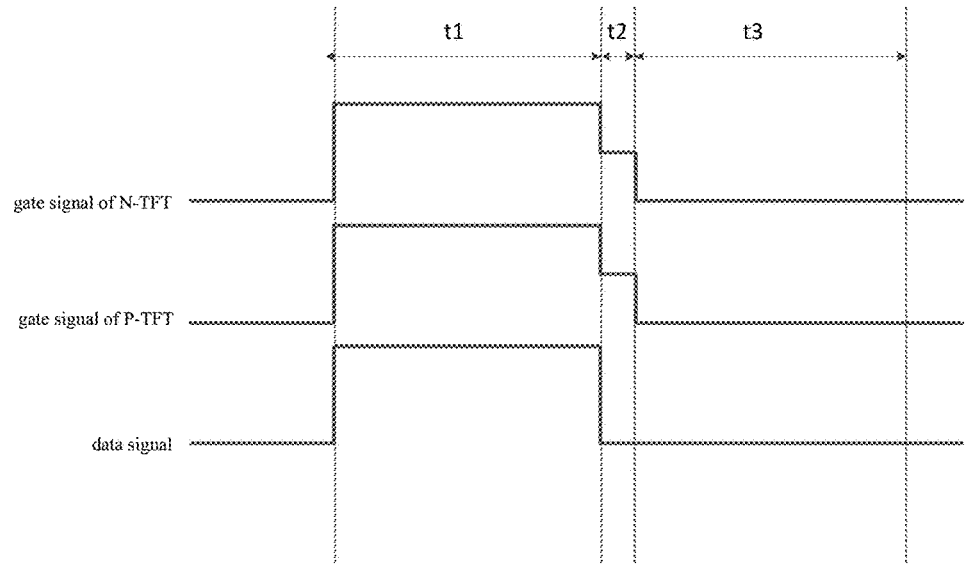
FIG. 9 is a schematic diagram of a driving method of a display device provided by an embodiment of the present disclosure.

As illustrated in FIG. 9, applying a gate turn-on signal to the second TFT 31 in an entire time upon a gate turn-off signal being applied to the first TFT 30.

Figure 10:
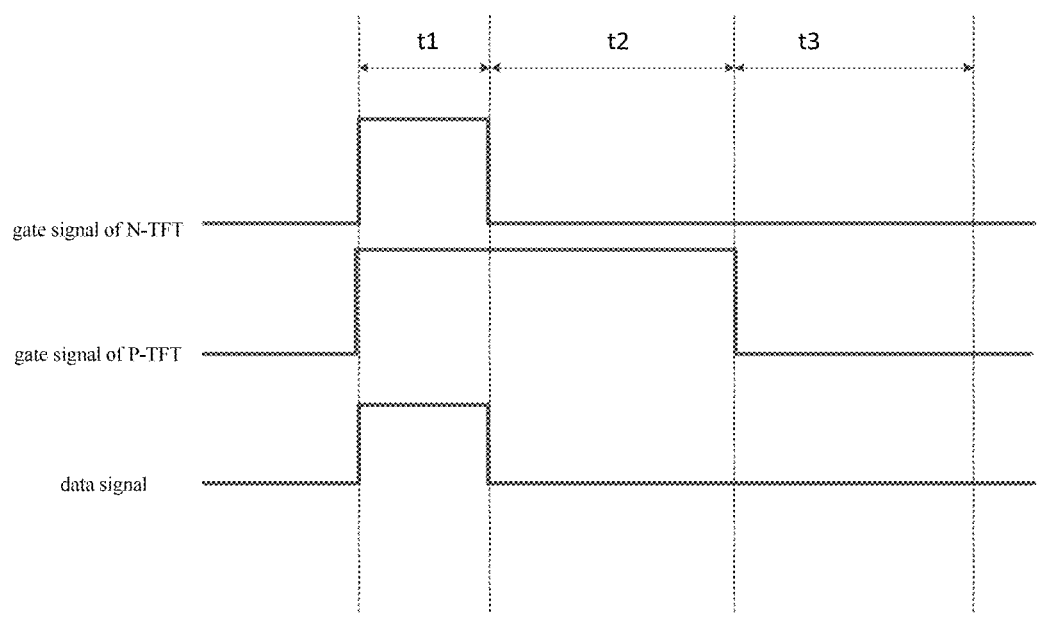
FIG. 10 is a schematic diagram of a driving method of a display device provided by another embodiment of the present disclosure.

As illustrated in FIG. 10, applying a gate turn-on signal to the second TFT 31 in a portion of a time upon a gate turn-off signal being applied to the first TFT 30.

The following is illustrated with reference to the case where the first TFT 30 is an N-TFT, and the second TFT 31 is a P-TFT, by way of example.

For example, the first TFT 30 and the second TFT 31 of the display device share the same gate line (as illustrated in FIG. 3A), and can be applied with the same gate signal. The gate signal applied to the first TFT 30 and the second TFT 31, and a data signal provided for the pixel is illustrated in FIG. 9.

FIG. 9 is a schematic diagram of a driving voltage of a pixel driving structure provided by an embodiment of the present disclosure, the gate line 20 provides gate signals for the first TFT 30 (N-TFT) and the second TFT 31 (P-TFT). Time t1 is a pixel charging and voltage sustaining stage. At this stage, the gate signal is at a high voltage level, the N-TFT is turned on, the pixel is charged and maintained, and the pixel is lit. Correspondingly, the data signal provides a charging voltage for the pixel, and the P-TFT is turned off. Time t2 is a turn-off stage of the N-TFT. For example, during the process of being turned off, the voltage can be stepped down in two or more stages, which can reduce a charge accumulation and reduce the risk of flicker. Of course, the turn-off process can also be performed not in a stepped way, which is not limited herein. Time t3 is a pixel turn-off stage, in which the gate signal is at a low voltage level, the N-TFT is turned off, the P-TFT is turned on, and a leakage current and/or an induced current can be conducted away by the P-TFT. In the driving method provided by the embodiment of the present disclosure, the gate signals are applied to the first TFT 30 and the second TFT 31 simultaneously, and the same gate line can be used to simplify the manufacture process.

For example, the first TFT 30 and the second TFT 31 are provided with respective gate lines of their own (as illustrated in FIG. 6), the first TFT 30 and the second TFT 31 can be applied with signals separately, for example, the first gate line 21 provides a gate signal for the first TFT 30 (N-TFT), the second gate line 22 provides a gate signal for the second TFT 31 (P-TFT). The gate signals applied to the first TFT 30 and the second TFT 31 and the data signals applied to the pixels are illustrated in FIG. 10.

FIG. 10 is another schematic diagram of a driving voltage of a pixel driving structure provided by an embodiment of the present disclosure. Time t1 is a pixel charging stage. At this stage, the gate signal of the N-TFT is at a high voltage level (a gate turn-on stage of the N-TFT, a gate turn-off stage of the P-TFT), the N-TFT is turned on, and the pixel is charged. Correspondingly, the data signal provides a charging voltage for the pixel, and the P-TFT is turned off. Time t2 is a pixel sustaining stage (a gate turn-off stage of the N-TFT, a gate turn-on stage of the P-TFT), the gate signal of the N-TFT is at a low voltage level, the N-TFT is turned off, the gate signal of the P-TFT is at a high voltage level, the P-TFT is turned off, and the pixel voltage is maintained. That is, in a stage upon the N-TFT being turned on and the pixel voltage being maintained, the P-TFT is turned off. Time t3 is a pixel turn-off stage (a gate turn-off stage of the N-TFT, a gate turn-on stage of the P-TFT), at this stage, the gate signal of the N-TFT is at a low voltage level, and the N-TFT is turned off, while the gate signal of the P-TFT is at a high voltage level, and the P-TFT is turned on, so that the leakage current and/or induced current can be conducted away. The driving method provided by the present embodiment, different gate signals can be applied to the first TFT 30 and the second TFT 31, a gate turn-on signal is applied to the second thin film transistor in a portion of the time upon a gate turn-off signal being applied to the first thin film transistor, which balances the sustaining of the pixel and the conducting of leakage current and/or induced current. Although the manufacture of another gate line is added, the gate turn-on time does not need to be extended and power consumption is not increased.

The above are illustrated with reference to the case where the first TFT 30 is an N-TFT, the second TFT 31 is a P-TFT, by way of example, and embodiments of the present disclosure are not limited to this. The first TFT 30 may be a P-TFT, and the second TFT 31 may be an N-TFT, a corresponding gate signal and the applied data voltage signal and their schematic diagrams are omitted herein.

In the embodiments of the present disclosure, the same or similarities can be referred to each other in the array substrate, the manufacturing method thereof, the display device, and the driving method of the display device.

The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should be understood that, in the case in which a component or element such as a layer, film, area, substrate or the like is referred to be "on" or "under" another component or element, it may be directly on or under the another component or element, or a component or element is interposed therebetween.

(4) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An array substrate, comprising:
    a first thin film transistor, comprising a first electrode, a second electrode, and a first gate electrode;
    a second thin film transistor, comprising a third electrode, a fourth electrode, and a second gate electrode, the fourth electrode electrically connected to a reference voltage terminal, the third electrode electrically connected with the second electrode; and
    a pixel electrode, electrically connected to both the first thin film transistor and the second thin film transistor, the second thin film transistor being configured to conduct away a turn-off current of the first thin film transistor upon the first thin film transistor being turned off,
    wherein the first electrode is electrically connected to a data line, the data line is configured to provide a data voltage for the pixel electrode via the first thin film transistor, and the first gate electrode is electrically connected to a gate line, the gate line is configured to turn on and off of the first thin film transistor,
    wherein a voltage at the second electrode is pulled down to the voltage at the reference voltage terminal if the first thin film transistor is turned off, and a voltage at the second electrode is charged to the data voltage if the first thin film transistor is turned on,
    wherein both the first thin film transistor and the second thin film transistor are located on a base substrate, the first thin film transistor further comprises a first active layer, the second thin film transistor further comprises a second active layer, the first electrode and the second electrode are spaced apart from each other and are in contact with the first active layer, the third electrode and the fourth electrode are spaced apart from each other and are in contact with the second active layer, the first electrode and the second electrode are located at a side of the first active layer away from the first gate electrode, the second active layer is located at a side of the third electrode and the fourth electrode away from the second gate electrode, the first gate electrode is directly opposite to the first active layer in a direction perpendicular to the base substrate, the second gate electrode is directly opposite to the second active layer in a direction perpendicular to the base substrate, and a gate insulating layer is arranged between the first active layer and the first gate electrode, and between the second active layer and the second gate electrode,
    wherein a passivation layer is formed on the second active layer, the pixel electrode is electrically connected to both the first thin film transistor and the second thin film transistor by a via hole in the passivation layer, and
    wherein the fourth electrode is connected to the reference voltage terminal by a via hole penetrating the gate insulating layer.

2. The array substrate according to claim 1, wherein the first thin film transistor is used as a switching element to control a pixel to which the first thin film transistor belongs to be turned on or turned off.

3. The array substrate according to claim 1, wherein one of the first thin film transistor and the second thin film transistor is an N-type thin film transistor, and the other of the first thin film transistor and the second thin film transistor is a P-type thin film transistor.

4. The array substrate according to claim 1, wherein the reference voltage terminal is configured to output a common voltage.

5. The array substrate according to claim 1, wherein the the first gate electrode is electrically connected with the second gate electrode.

6. The array substrate according to claim 1, wherein a material of one of the first active layer and the second active layer comprises a-Si, p-Si or metal oxide, and a material of the other of the first active layer and the second active layer comprises triphenyl amine, pentacene, phthalocyanine or oligothiophene.

7. The array substrate according to claim 1, wherein the second thin film transistor is configured to be turned off at least at a time upon the first thin film transistor being turned on.

8. A manufacturing method of an array substrate, comprising:
    forming a first thin film transistor, comprising a first electrode, a second electrode, and a first gate electrode;
    forming a second thin film transistor comprising a third electrode, a fourth electrode and a second gate electrode, the fourth electrode being electrically connected to a reference voltage terminal, the third electrode electrically connected with the second electrode; and
    forming a pixel electrode, the pixel electrode being electrically connected to both the first thin film transistor and the second thin film transistor, wherein the second thin film transistor is configured to conduct away a turn-off current of the first thin film transistor upon the first thin film transistor being turned off,
    wherein the first electrode is electrically connected to a data line, the data line is configured to provide a data voltage for the pixel electrode via the first thin film transistor, and the first gate electrode is electrically connected to a gate line, the gate line is configured to turn on and off of the first thin film transistor,
    wherein a voltage at the second electrode is pulled down to the voltage at the reference voltage terminal if the first thin film transistor is turned off; and a voltage at the second electrode is charged to the data voltage if the first thin film transistor is turned on,
    wherein both the first thin film transistor and the second thin film transistor are located on a base substrate, the first thin film transistor further comprises a first active layer, the second thin film transistor further comprises a second active layer, the first electrode and the second electrode are spaced apart from each other and are in contact with the first active layer, the third electrode and the fourth electrode are spaced apart from each other and are in contact with the second active layer, the first electrode and the second electrode are located at a side of the first active layer away from the first gate electrode, the second active layer is located at a side of the third electrode and the fourth electrode away from the second gate electrode, the first gate electrode is directly opposite to the first active layer in a direction perpendicular to the base substrate, the second gate electrode is directly opposite to the second active layer in a direction perpendicular to the base substrate, and a gate insulating layer is arranged between the first active layer and the first gate electrode, and between the second active layer and the second gate electrode, wherein a passivation layer is formed on the second active layer, the pixel electrode is electrically connected to both the first thin film transistor and the second thin film transistor by a via hole in the passivation layer, and wherein the fourth electrode is connected to the reference voltage terminal by a via hole penetrating the gate insulating layer.

9. The manufacturing method of the array substrate according to claim 8, wherein the first thin film transistor is used as a switching element to control a pixel to which the first thin film transistor belongs to be turned on or turned off.

10. The manufacturing method of the array substrate according to claim 8, wherein one of the first thin film transistor and the second thin film transistor is an N-type thin film transistor, and the other of the first thin film transistor and the second thin film transistor is a P-type thin film transistor.

11. A display device, comprising the array substrate according to claim 1.

12. The display device according to claim 11, wherein the display device comprises a liquid crystal display device.

\* \* \* \* \*